(12) United States Patent
Liu et al.

(10) Patent No.: US 7,589,338 B2
(45) Date of Patent: Sep. 15, 2009

(54) SEMICONDUCTOR DIE PACKAGES SUITABLE FOR OPTOELECTRONIC APPLICATIONS HAVING CLIP ATTACH STRUCTURES FOR ANGLED MOUNTING OF DICE

(75) Inventors: Yong Liu, Scarborough, ME (US); Zhengyu Zhu, Jiangsu (CN); Zhongfa Yuan, Jiangsu (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/948,170

(22) Filed: Nov. 30, 2007

(65) Prior Publication Data

US 2009/0140179 A1 Jun. 4, 2009

(51) Int. Cl.
  *G02B 27/00* (2006.01)
  *H01L 29/16* (2006.01)
(52) U.S. Cl. ......................... 250/551; 257/82
(58) Field of Classification Search ............... 250/221, 250/551; 257/80–82
See application file for complete search history.

(56) References Cited

U.S. PATENT DOCUMENTS

| | | | |
|---|---|---|---|
| 3,956,821 A | 5/1976 | Martin | |
| 4,058,899 A | 11/1977 | Phy | |
| 4,191,943 A | 3/1980 | Cairns et al. | |
| 4,680,613 A | 7/1987 | Daniels et al. | |
| 4,720,396 A | 1/1988 | Wood | |
| 4,731,701 A | 3/1988 | Kuo et al. | |
| 4,751,199 A | 6/1988 | Phy | |
| 4,772,935 A | 9/1988 | Lawler et al. | |
| 4,791,473 A | 12/1988 | Phy | |
| 4,796,080 A | 1/1989 | Phy | |
| 4,839,717 A | 6/1989 | Phy et al. | |
| 4,890,153 A | 12/1989 | Wu | |
| 4,954,853 A * | 9/1990 | Yoshida et al. ................. 257/82 |
| 5,327,325 A | 7/1994 | Nicewarwarner, Jr. | |
| 5,327,443 A * | 7/1994 | Tanaka et al. .................. 372/36 |
| 5,646,446 A | 7/1997 | Nicewarner, Jr. et al. | |
| 5,776,797 A | 7/1998 | Nicewarner, Jr. et al. | |
| 6,133,634 A | 10/2000 | Joshi | |
| 6,329,706 B1 | 12/2001 | Nam | |
| 6,432,750 B2 | 8/2002 | Jeon et al. | |
| 6,449,174 B1 | 9/2002 | Elbanhawy | |
| 6,489,678 B1 | 12/2002 | Joshi | |
| 6,556,750 B2 | 4/2003 | Constantino et al. | |
| 6,566,749 B1 | 5/2003 | Joshi et al. | |
| 6,574,107 B2 | 6/2003 | Jeon et al. | |

(Continued)

OTHER PUBLICATIONS

U.S. Appl. No. 11/861,967, filed Sep. 26, 2007 entitled "Stacked Dual-Die Packages, Methods of Making, and Systems Incorporating Said Packages".

(Continued)

*Primary Examiner*—Thanh X Luu
(74) *Attorney, Agent, or Firm*—Townsend and Townsend and Crew LLP

(57) ABSTRACT

An optocoupler package is disclosed. The package includes a substrate comprising a substrate surface, a first device, and a clip structure attached to the first device. The clip structure and the first device are mounted on the substrate, and the first device is oriented at an angle with respect to the substrate surface. A second device is mounted on the substrate, where the first device is capable of communicating with the second device.

26 Claims, 9 Drawing Sheets

U.S. PATENT DOCUMENTS

| | | |
|---|---|---|
| 6,621,152 B2 | 9/2003 | Choi et al. |
| 6,627,991 B1 | 9/2003 | Joshi |
| 6,645,791 B2 | 11/2003 | Noquil et al. |
| 6,674,157 B2 | 1/2004 | Lang |
| 6,683,375 B2 | 1/2004 | Joshi |
| 6,696,321 B2 | 2/2004 | Joshi |
| 6,720,642 B1 | 4/2004 | Joshi et al. |
| 6,731,003 B2 | 5/2004 | Joshi et al. |
| 6,740,541 B2 | 5/2004 | Rajeev |
| 6,756,689 B2 | 6/2004 | Nam et al. |
| 6,774,465 B2 | 8/2004 | Lee et al. |
| 6,777,800 B2 | 8/2004 | Madrid et al. |
| 6,806,580 B2 | 10/2004 | Joshi et al. |
| 6,830,959 B2 | 12/2004 | Estacio |
| 6,836,023 B2 | 12/2004 | Joshi et al. |
| 6,867,481 B2 | 3/2005 | Joshi et al. |
| 6,867,489 B1 | 3/2005 | Estacio |
| 6,891,256 B2 | 5/2005 | Joshi et al. |
| 6,891,257 B2 | 5/2005 | Chong et al. |
| 6,893,901 B2 | 5/2005 | Madrid |
| 6,943,434 B2 | 9/2005 | Tangpuz et al. |
| 6,989,588 B2 | 1/2006 | Quinones et al. |
| 6,992,384 B2 | 1/2006 | Joshi |
| 7,022,548 B2 | 4/2006 | Joshi et al. |
| 7,023,077 B2 | 4/2006 | Madrid |
| 7,061,077 B2 | 6/2006 | Joshi |
| 7,061,080 B2 | 6/2006 | Jeun et al. |
| 7,081,666 B2 | 7/2006 | Joshi et al. |
| 7,122,884 B2 | 10/2006 | Cabahug et al. |
| 7,154,168 B2 | 12/2006 | Joshi et al. |
| 7,157,799 B2 | 1/2007 | Noquil et al. |
| 7,196,313 B2 | 3/2007 | Quinones et al. |
| 7,199,461 B2 | 4/2007 | Son et al. |
| 7,208,819 B2 | 4/2007 | Jeun et al. |
| 7,215,011 B2 | 5/2007 | Joshi et al. |
| 7,217,594 B2 | 5/2007 | Manatad |
| 7,242,076 B2 | 7/2007 | Dolan |
| 7,256,479 B2 | 8/2007 | Noquil et al. |
| 7,268,414 B2 | 9/2007 | Choi et al. |
| 7,271,497 B2 | 9/2007 | Joshi et al. |
| 7,285,849 B2 | 10/2007 | Cruz et al. |
| 7,315,077 B2 | 1/2008 | Choi et al. |
| 2002/0092967 A1* | 7/2002 | Matsumoto ............ 250/208.1 |
| 2004/0101260 A1* | 5/2004 | Sato ............................ 385/94 |
| 2004/0190274 A1* | 9/2004 | Saito et al. .................. 361/783 |
| 2005/0047730 A1* | 3/2005 | Ellison ........................ 385/92 |
| 2005/0047731 A1* | 3/2005 | Hu et al. ..................... 385/92 |
| 2005/0249449 A1* | 11/2005 | Welch et al. ................. 385/14 |
| 2006/0001183 A1* | 1/2006 | Nguyen et al. ............... 264/1.7 |
| 2007/0063125 A1* | 3/2007 | Downing, Jr. ............... 250/205 |

OTHER PUBLICATIONS

U.S. Appl. No. 11/948,081, filed Nov. 30, 2007 entitled "Package Including Oriented Devices".
U.S. Appl. No. 11/971,512, filed Jan. 9, 2008 entitled "Package With Overlapping Devices".
U.S. Appl. No. 11/971,556, filed Jan. 9, 2008 entitled "Die Package Including Substrate With Molded Device".

* cited by examiner

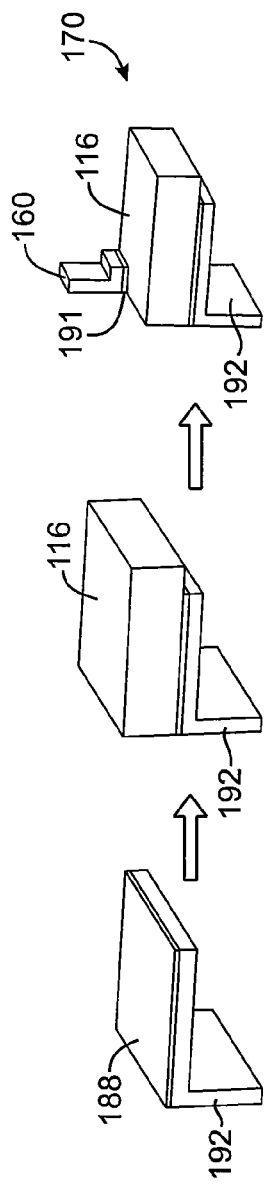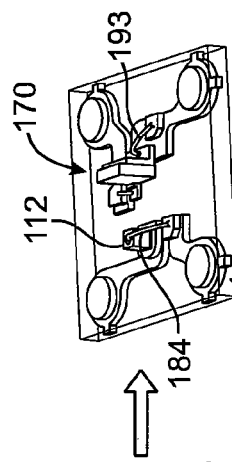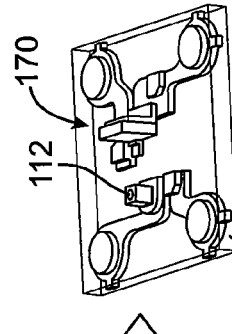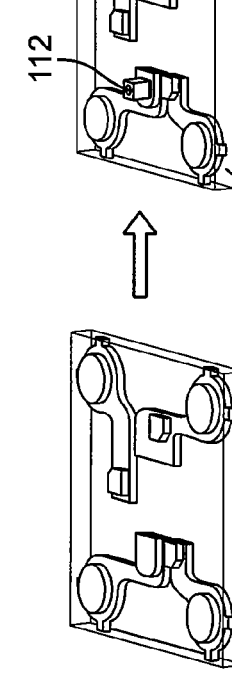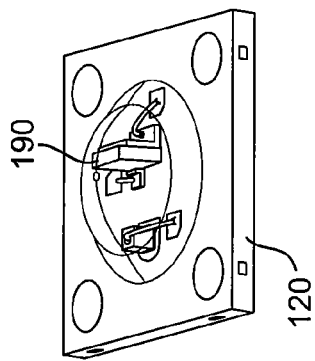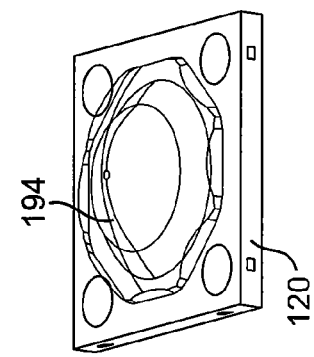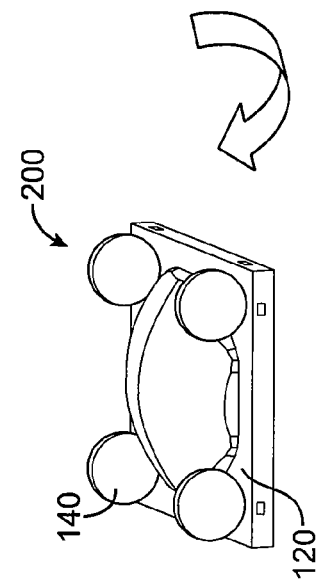

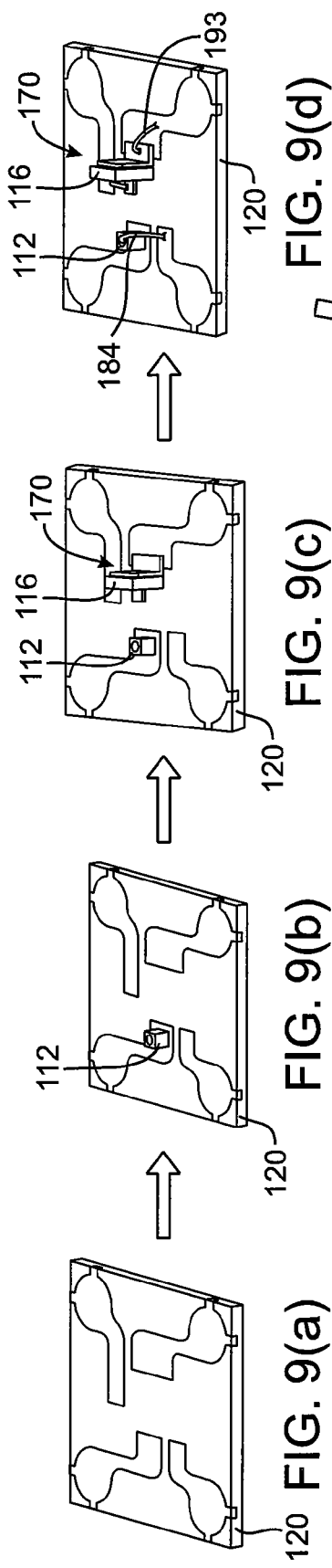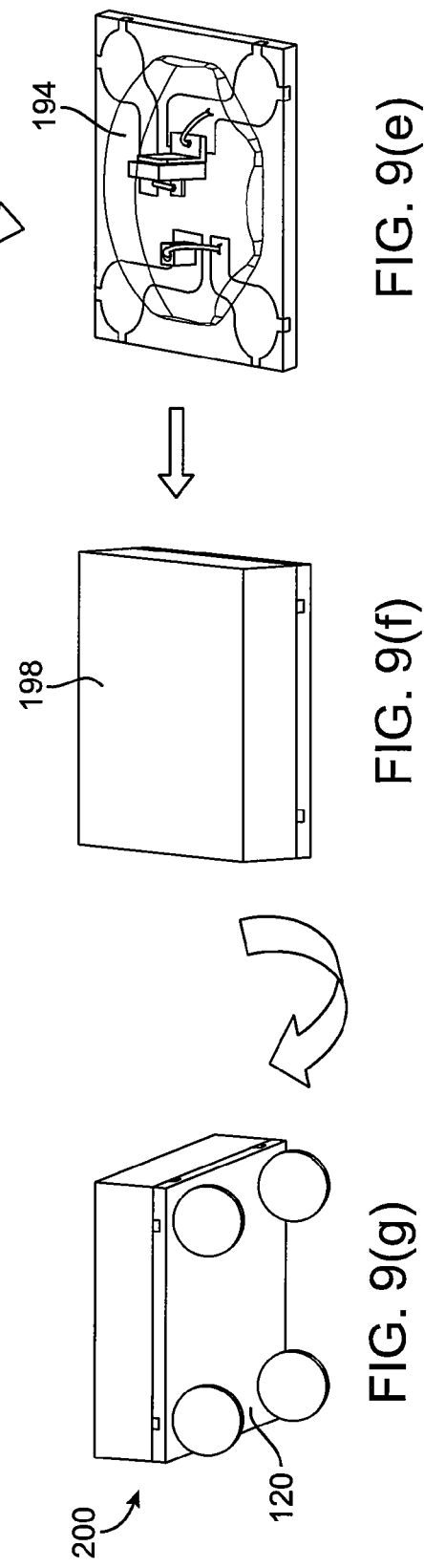

SEMICONDUCTOR DIE PACKAGES SUITABLE FOR OPTOELECTRONIC APPLICATIONS HAVING CLIP ATTACH STRUCTURES FOR ANGLED MOUNTING OF DICE

CROSS-REFERENCE TO RELATED APPLICATIONS

This application is related to U.S. patent application Ser. No. 11/948,081, entitled "Package Including Oriented Devices", which is being filed on the same day as the present application, Nov. 30, 2007, and is herein incorporated by reference in its entirety for all purposes.

BACKGROUND

Optocouplers contain at least one optical emitter device which is optically coupled to an optical receiver device through an optically transmissive medium. This arrangement permits the passage of information from one electrical circuit that contains the optical emitter device to another electrical circuit that contains the optical receiver device. A high degree of electrical isolation is maintained between the two circuits. Because information is passed optically across an insulating gap, the transfer is one way. For example, the optical receiver device cannot modify the operation of a circuit containing the optical emitter device. This feature is desirable because, for example, the emitter may be driven by a low voltage circuit using a microprocessor or logic gates, while the output optical receiver device may be part of a high voltage DC or AC load circuit. The optical isolation also prevents damage to the input circuit caused by the relatively hostile output circuit.

FIG. 1 shows a side view of a conventional optocoupler package 10. The illustrated optocoupler 10 includes a substrate 24, and solder balls 18 on the substrate 24. An LED (light emitting diode) device 16 including an optical emitter surface 16(a) and a phototransistor device 12 (including an optical receiver surface 12(a)) are on the substrate 24 and are covered by an optically transmissive medium 22.

The output current generated by phototransistor (diode) device 12 is low (e.g., about several nA, the same level as noise) due to the low efficiency of the phototransistor 12 device to receive very limit light emitting by LED. The optical receiver surface 12(a) of photo transistor 12 does not face the optical emitting surface 16(a) of LED device 16. Consequently, light rays 20 from the LED device 16 hit the optical receiver device 12 and the optical receiver surface 12(a) of photo transistor (or diode) less than 10% of the time.

In addition, the positions of the LED device 16 and the phototransistor 12 are defined by the pads formed in the substrate 24. This can limit one's ability to form optocoupler packages with different device configurations.

Embodiments of the invention address this problem and other problems, individually and collectively.

SUMMARY

Embodiments of the invention are directed to optocoupler packages, optocoupler assemblies, and methods for making the same.

One embodiment of the invention is directed to a package comprising a substrate comprising a substrate surface, a first device, and a clip structure attached to the first device. The clip structure and the first device are mounted on the substrate, and the first device is oriented at an angle with respect to the substrate surface. A second device is mounted on the substrate, and the first device is capable of communicating with the second device.

Another embodiment of the invention is directed to an optocoupler package comprising a substrate comprising a substrate surface, a first optoelectronic device, and a clip structure attached to the first optoelectronic device. The clip structure and the first optoelectronic device are mounted on the substrate. The first optoelectronic device is oriented at an angle with respect to the substrate surface, and a second optoelectronic device is mounted on the substrate. The first optoelectronic device is capable of communicating with the second device.

Another embodiment of the invention is directed to a method for making a package comprising obtaining a substrate comprising a substrate surface, obtaining a first device, attaching a clip structure to the first device, and attaching the clip structure and the first device to the substrate. The first device is oriented at an angle with respect to the substrate surface. The method also includes attaching a second device to the substrate. The first device is capable of communicating with the second device after the first device and the second device are attached to the substrate.

Another embodiment of the invention is directed to a method for making an optocoupler package. The method comprises obtaining a substrate comprising a substrate surface, obtaining a first optoelectronic device, attaching a clip structure to the first optoelectronic device, and attaching the clip structure and the first optoelectronic device to the substrate. The first optoelectronic device is oriented at an angle with respect to the substrate surface. The method further comprises attaching a second optoelectronic device to the substrate. The first optoelectronic device is capable of communicating with the second optoelectronic device after the first optoelectronic device and the second optoelectronic device are attached to the substrate These and other embodiments of the invention are described in further detail below with reference to the Drawings.

BRIEF DESCRIPTION OF THE DRAWINGS

FIGS. 5(a)-5(j) show components of an optocoupler package as it is being assembled.

FIGS. 9(a)-9(g) show components of an optocoupler package as it is being assembled.

In the Figures, like numerals designate like elements.

DETAILED DESCRIPTION

Some embodiments of the invention can provide for the vertical alignment of an optical receiver device such as a phototransistor and an optical emitter device such as an LED in an optocoupler package. The phototransistor (or diode) may face the LED emissive area directly. Other embodiments of the invention are directed to methods of assembling clips to optoelectronic devices such as optical receiver devices to form device assemblies, which can be mounted on a substrate such as a premolded substrate. Some embodiments of the invention can improve the photoelectrical conversion ratio between an LED and phototransistor (or diode) by directly facing the LED emitting surface to receiver surface of photo transistor (or diode) in an optocoupler package, which makes the light from the LED hit the receiver surface of photo transistor (or diode) more than 80% of the time. The clips can allow optoelectronic devices to be oriented vertically with respect to a surface of the substrate. In some embodiments of the invention, an optically coupling gel dome or other medium material can be formed on the optoelectronic devices. Further molding processes may also be performed after a gel dome is formed on the substrate.

Embodiments of the invention may be used in a standard microcoupler BGA package or a fully molded package with a BGA type of foot print package. Embodiments of the invention can also be used as a standard surface mount type LGA device (without solder balls).

One embodiment of the invention is directed to a package comprising a substrate comprising a substrate surface, a first device, and a clip structure attached to the first device. The clip structure and the first device are mounted on the substrate, and the first device is oriented at an angle with respect to the substrate surface. A second device is also mounted on the substrate, and the first device is capable of communicating with the second device. For example, the first device can communicate with the second device using optical signals.

The first and second devices are preferably optoelectronic devices. In some embodiments, the first device is an optical emitter device such as an LED and the second device is an optical receiver device such as a phototransistor. However, in other embodiments, the first and/or the second device could be purely electrical devices such as MOSFETs, control ICs, etc.

Figure 1:
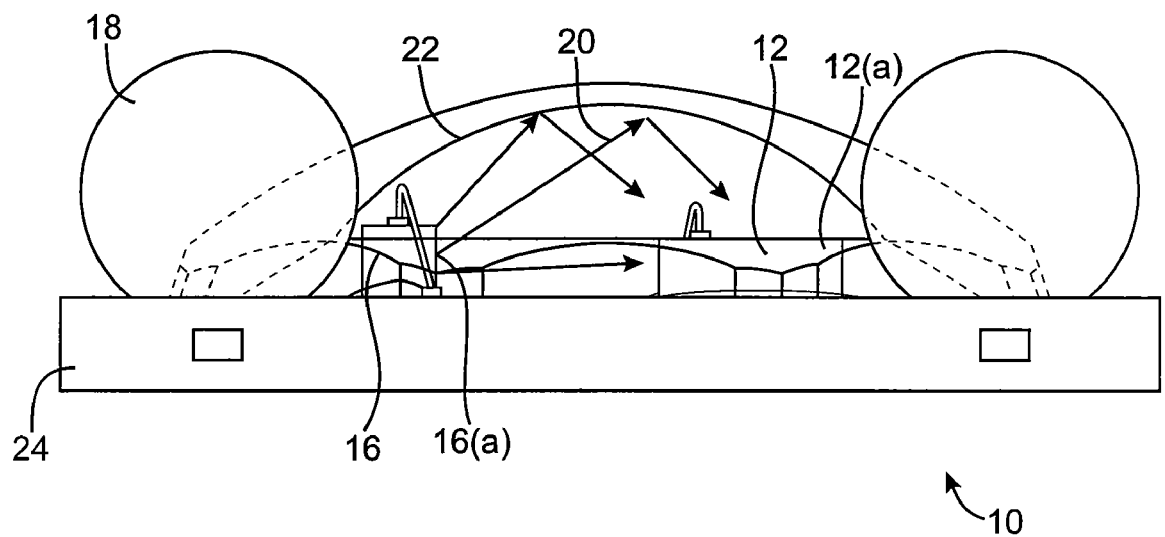
FIG. 1 shows a diagram of a conventional optocoupler package.
Figure 2:
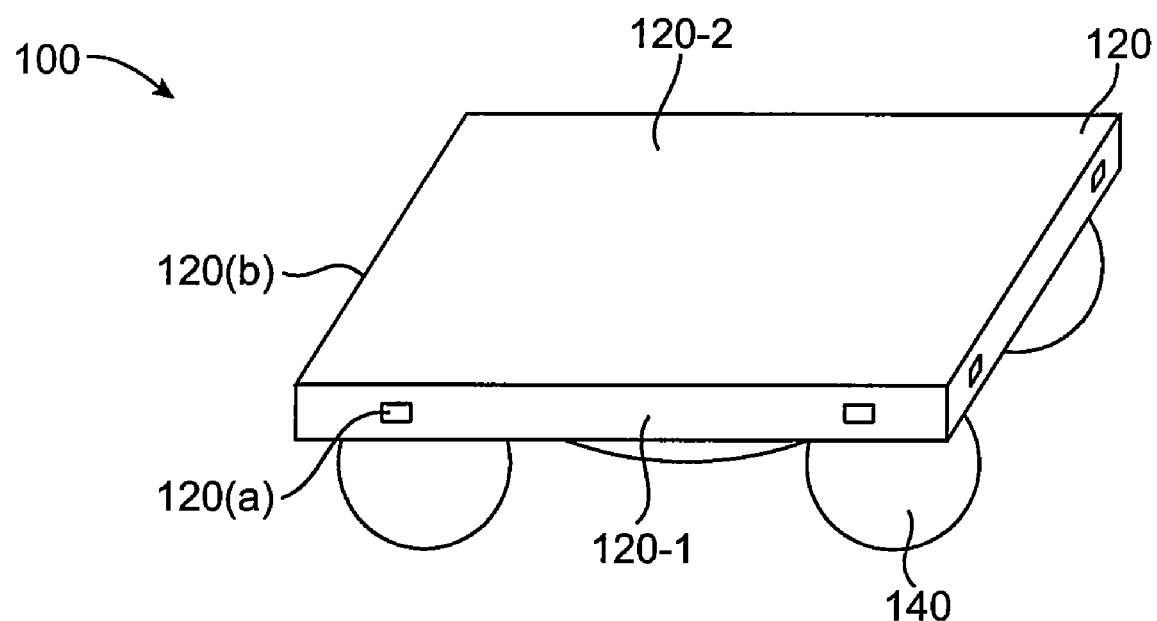
FIG. 2 shows a perspective view of an optocoupler package according to an embodiment of the invention, in a "live bug" position.

FIG. 2 shows a perspective view of an optocoupler package 100 according to an embodiment of the invention, in a "live bug" position. While the package 100 may have any suitable dimensions, exemplary dimensions may be about 3.5×3.5× 1.2 mm³. Thus, the package 100 can have dimensions less than about 5 mm³ in some embodiments.

The package 100 comprises a substrate 120. In this embodiment, the substrate 120 is a premolded substrate, which comprises a leadframe structure 120(a) and a molding material 120(b) such as an epoxy molding material. The substrate 120 comprises a first surface 120-1 and a second surface 120-2 opposite the first surface 120-2.

A typical premolded substrate comprises a leadframe structure and a molding material. The leadframe structure typically comprises a main area with a plurality of leads extending from the main area. The molding material exposes one or more surfaces of the leadframe structure. Surfaces of the molding material can be substantially coplanar with surfaces of the leadframe structure. Further details regarding the premolded substrates can be found in U.S. Pat. No. 7,061, 077, which is herein incorporated by reference in its entirety for all purposes. Other types of substrates may include conventional interposers, printed circuit boards, etc.

Figure 3:
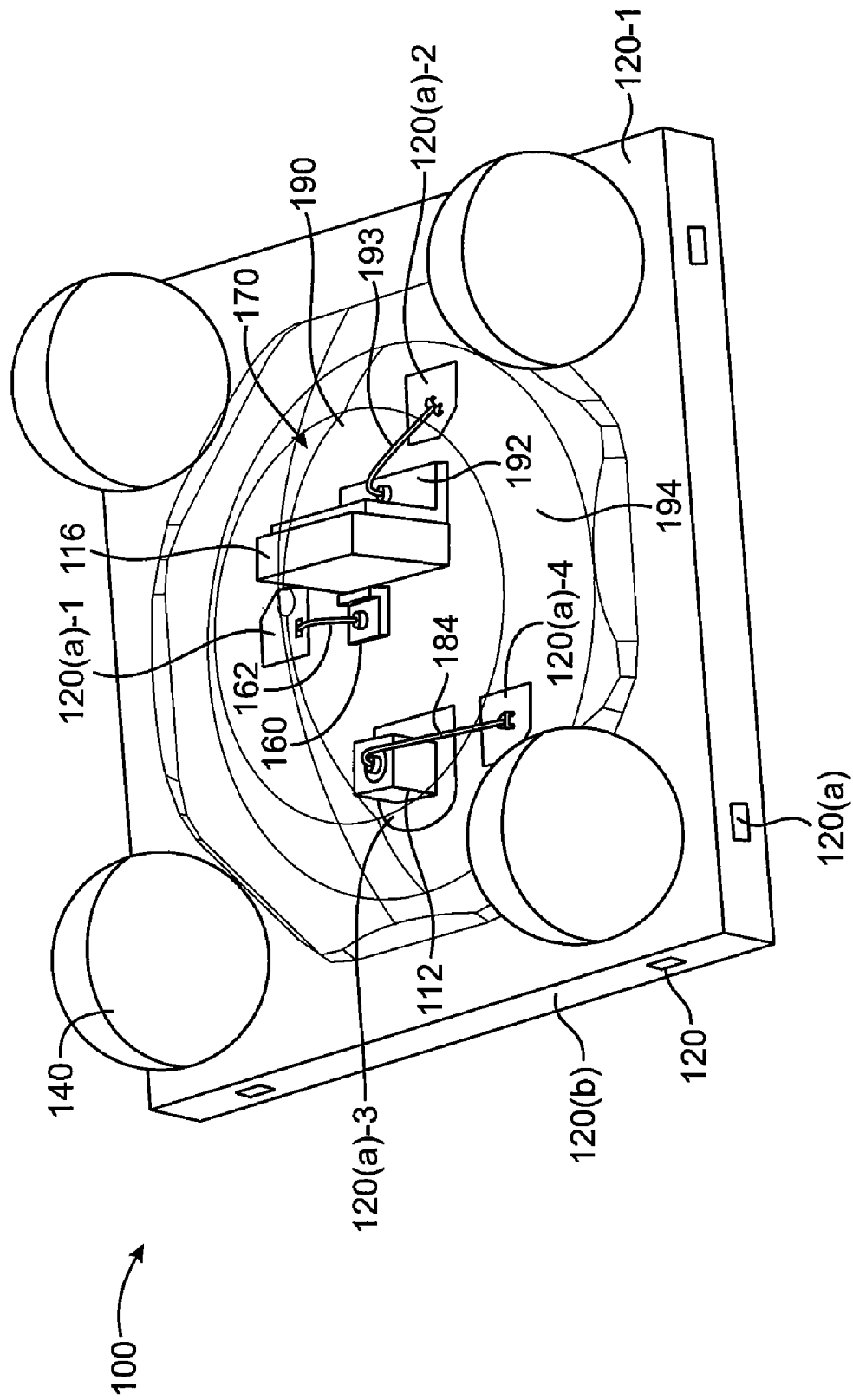
FIG. 3 shows a perspective view of an optocoupler package according to an embodiment of the invention in a "dead bug" position. Components inside of the optocoupler package can be seen.

FIG. 3 shows a perspective view of the optocoupler package 100 shown in FIG. 2, in a "dead bug" position. Some components inside of the optocoupler package 100 can be seen.

FIG. 3 shows a substrate 120, and solder balls 140 on the first surface 120-1 and at corners of the substrate 120. As explained above the substrate 120 comprises a leadframe structure 120(a) and a molding material 120(b) molded around the leadframe structure 120(a).

Solder balls 140 are attached to peripheral regions (e.g., corner regions) of the first surface 120-1. Exemplary solder balls 140 can have a radius on the order of about 1 mm (e.g., 0.75 mm) or less. As shown, the solder balls 140 (or other conductive structures) can have heights greater than the heights of the optical emitter device 112 and the optical receiver device 116. The solder balls 118 may act as input/output terminals for the optical emitter device 112 and the optical receiver device 116. While many of the specific embodiments discussed with reference to the figures use solder balls, it is understood that the solder balls could be replaced by other suitable conductive structures including conductive columns (e.g., electroplated columns such as electroplated copper columns).

The leadframe structure also a number of exposed regions 120(a)-1, 120(a)-2, 120(a)-3, 120(a)-4 that are exposed through the molding material 120(b). Exposed regions 120(a)-1, 120(a)-2, and 120(a)-4 can be regions that can be attached to one end of a wirebond, while region 120(a)-3 can be a region for receiving an optical emitter device 112. A wirebond 184 can electrically couple the optical emitter device 112 to the exposed region 120(a)-4 of the leadframe structure 120(a).

A device assembly 170 is mounted on the molding material 120(b) of the substrate 120. The device assembly 170 comprises an optical receiver device 116 sandwiched between a small L-shaped clip 160 and a large L-shaped clip 192. The optical receiver device 116 is attached to the L-shaped clips 160, 192 using solder or some other conductive adhesive. The large L-shaped clip 192 can be designed to accommodate and electrically connect to the rear major surface of the optical receiver device 116, whereas the small L-shaped clip 160 can be attached to a minor portion of the opposite front major surface of optical receiver device 116. As shown, one leg of each of the L-shaped clips 160, 192 can be attached to the optical receiver device 116, while the other legs of the L-shaped clips 160, 192 can be attached to ends of corresponding wirebonds 162, 193. Although L-shaped clips are disclosed, other clip configurations can be used in other embodiments of the invention and the form of the clip is not limiting.

As shown, a second wirebond 162 may bond the small L-shaped clip 160 to the exposed region 120(a)-1, while a third wirebond 193 may bond the large L-shaped clip 192 to another exposed region 120(a)-2. The wirebonds 162, 184, 193 may comprise gold wires, copper wires, noble metal coated copper wires, etc.

A light coupling gel material 190 may be deposited over the device assembly 170 as well as the optical emitter device 112. The light transmissive material 190 may be coated with a reflective material such as silver paint, or an opaque material 194 such as an epoxy glob top material, so that any light emitted from the optical emitter device 112 is reflected towards the optical receiver device 116.

The surface of the large L-shaped clip 192 that is attached to the optical receiver device 116 is substantially perpendicular to the surface of the L-shaped clip 192 that is attached to the substrate 120 and also the exposed surface 120(a)-2 of the leadframe structure 120(a) (which includes the first surface 120-1). Consequently, the optical emitter device 112 which is mounted on the die attach pad 120(a)-3 is oriented substantially perpendicular to the optical receiver device 116, and the first surface 120-1 of the substrate 120. This allows the emitter surface of the optical emitter device 112 to provide light substantially directly to the receiver surface of the optical receiver device 116. Although the optical emitter device 112 (and/or the first surface 120-1) and the optical receiver device 116 are oriented at an approximately 90 degree angle in this embodiment, they may be oriented at any suitable angle in other embodiments of the invention. For example, they could be oriented at an angle of about 45 or even about 135 degrees with respect to each other in other embodiments of the invention.

Figure 4B:
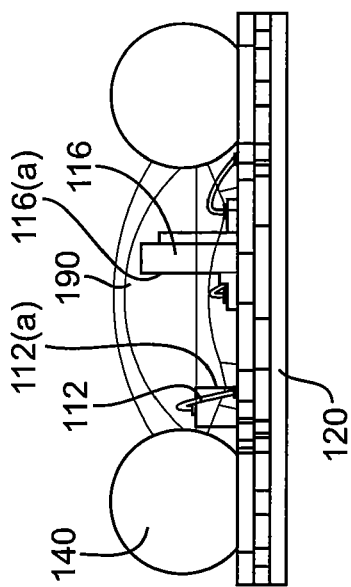
FIGS. 4(a), 4(b), and 4(c) respectively show top, and side views of the optocoupler package embodiment shown in FIG. 3, where components inside of the optocoupler package can be seen.
Figure 4A:
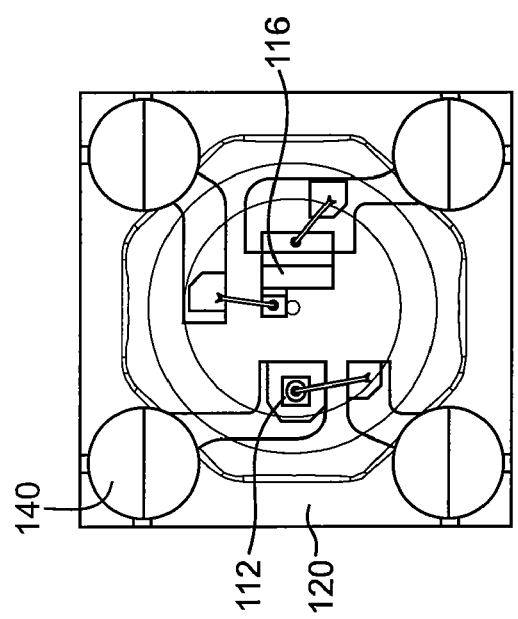
Figure 4C:
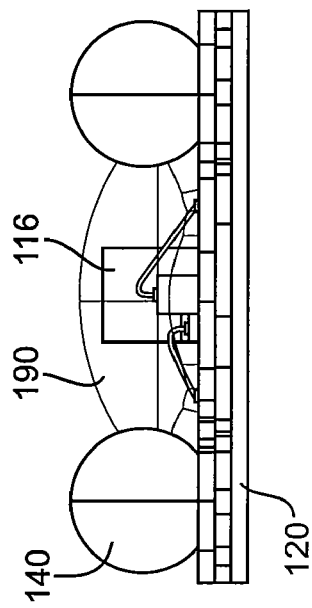

FIGS. 4(a), 4(b), and 4(c) respectively show top, and side views of the optocoupler package embodiment shown in FIG. 3, where components inside of the optocoupler package can be seen. As shown in FIG. 4(b), light from the emitter surface 112(a) of the optical emitter device 112 is received by the receiver surface 116(a) of the optical receiver device 116.

Some embodiments of the invention are directed to methods for making packages such as optocoupler packages. One method comprises obtaining a substrate comprising a substrate surface, obtaining a first optoelectronic device, attaching a clip structure to the first optoelectronic device, attaching the clip structure and the first optoelectronic device to the substrate, and attaching a second optoelectronic device to the substrate. After attaching the first and second optoelectronic devices to the substrate, the first optoelectronic device is oriented at an angle with respect to the substrate surface. The first optoelectronic device is capable of communicating with the second optoelectronic device after the first optoelectronic device and the second optoelectronic device are attached to the substrate. FIGS. 5(a)-5(j) show components of an optocoupler package as it is being assembled.

FIG. 5(a) shows a large L-shaped clip 192 with solder 188 coated on a die attach surface of the clip 192. As shown in FIG. 5(b), an optical receiver device 116 is then obtained and attached to the clip 192. After the optical receiver device 116 is attached to the large clip 192, the small clip 160 is attached to the opposite side of the optical receiver device 116 using solder 191. A device assembly 170 is thereafter formed.

As shown in FIG. 5(d), before or after the device assembly 170 is formed, the previously described substrate 120 can be obtained. As shown in FIG. 5(e), after the substrate 120 is obtained, an optical emitter device 112 can be mounted on an exposed region of the substrate 120. Before, during, or after the optical emitter device 112 is mounted on the substrate 120, as shown in FIG. 5(f), the device assembly 170 can be mounted to the substrate 120. As shown in FIG. 5(g), wirebonds 184, 193 can then be formed on the substrate 120, thereby electrically coupling the optical emitter device 112 to corresponding exposed regions, and electrically coupling the clips of the device assembly 170 to corresponding exposed regions of the substrate 120.

As shown in FIG. 5(h), after all devices are mounted to the substrate 120 and after all wirebonds are formed on the substrate 120, a light transmissive material 190 is deposited on the substrate 120 and covers the device assembly 170 and the optical emitter device 112. Then, a second coating 194 (e.g., of an epoxy material) is deposited on the light transmissive material 194 as shown in FIG. 5(i). After the second coating 194 is deposited on the light transmissive material 194, the solder balls 140 are deposited on the substrate 120 as shown in FIG. 5(j) to form an optocoupler package 200. FIG. 5(j) shows the optocoupler package 200 in a "dead bug" position.

Figure 6:
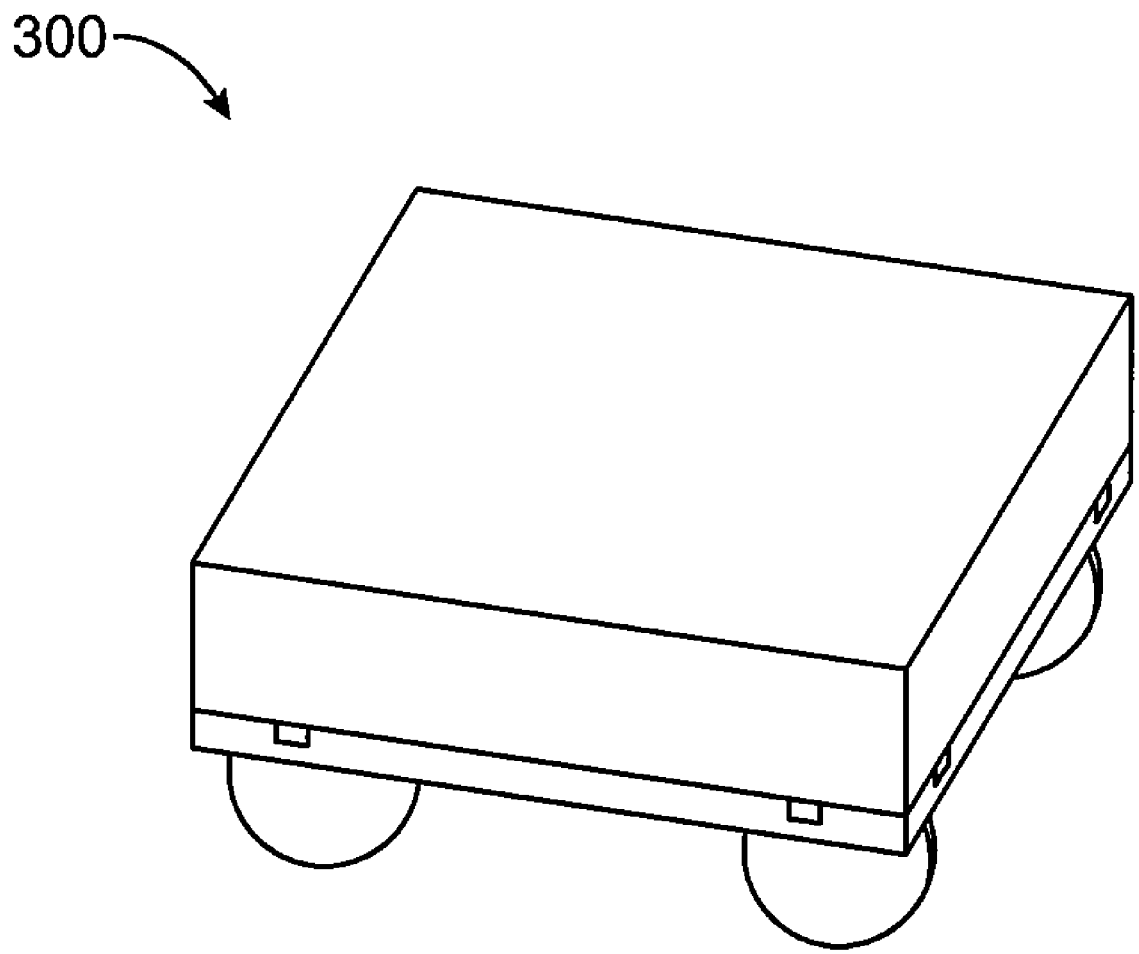
FIG. 6 shows another optocoupler package embodiment in a "live" bug position.

FIG. 6 shows another optocoupler package 300 embodiment in a live bug position.

Figure 7:
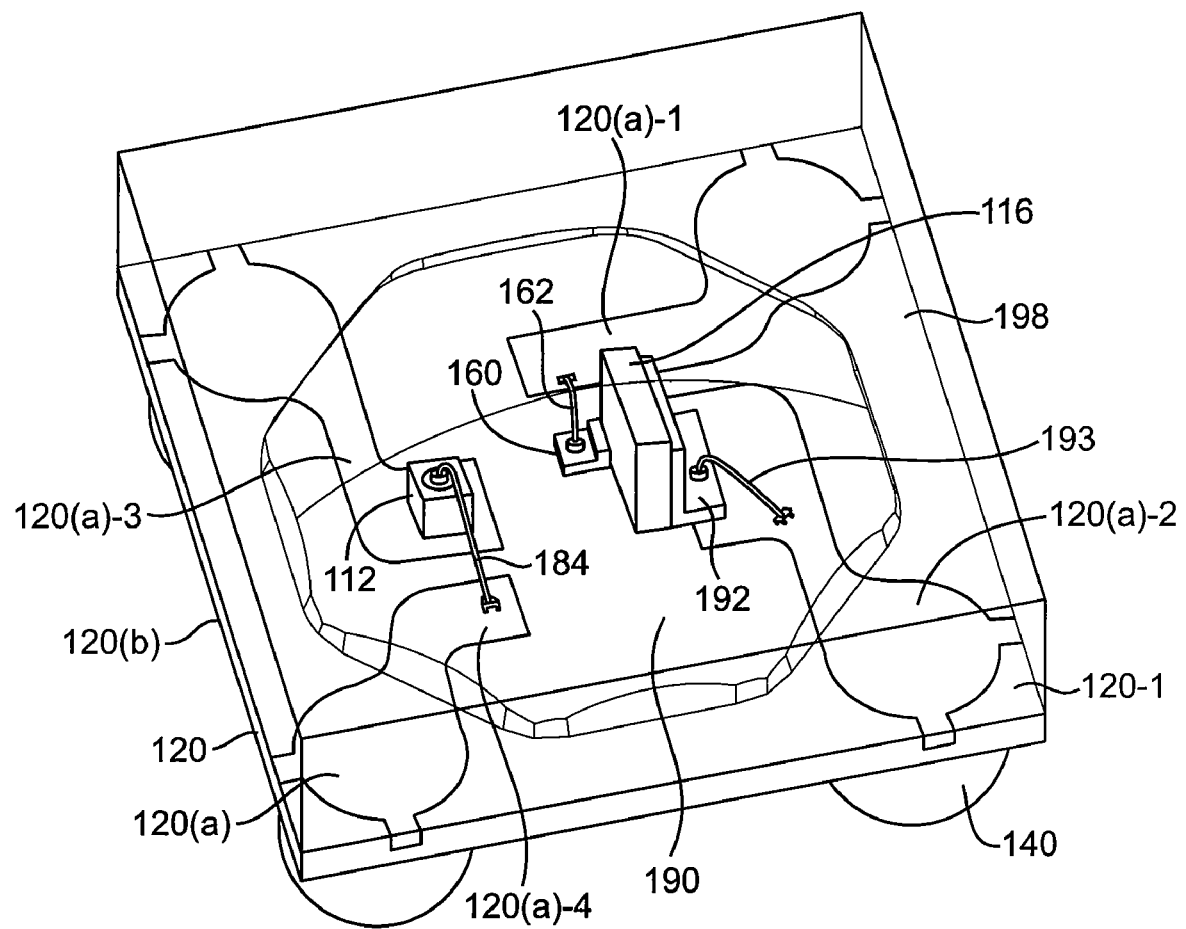
FIG. 7 shows the optocoupler package in FIG. 6 with some components inside of the optocoupler package being visible.

FIG. 7 shows the optocoupler package 300 in FIG. 6 with some components inside of the optocoupler package 300 being visible. In FIGS. 3 and 7, like numerals designate like elements. The construction of the embodiment in FIG. 7 is similar to the one in FIG. 3, except that solder balls 140 are mounted on the second surface 120-2 of the substrate 120 instead of the first surface 120-1 of the substrate. Also, a molding material 198 covers light coupling gel material 190. The molding material 198 may be an opaque epoxy molding compound material.

Figure 8A:
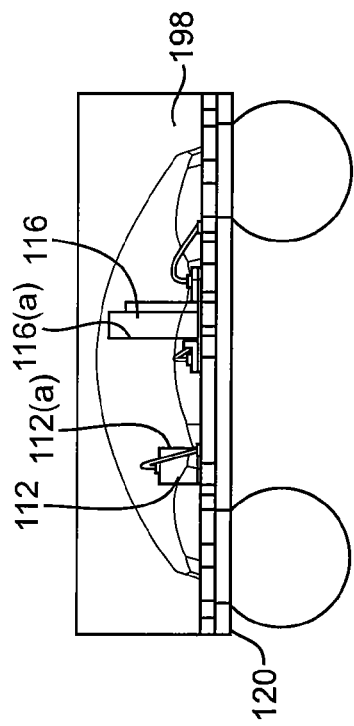
FIGS. 8(a), 8(b), and 8(c) respectively show top, and side views of the optocoupler package embodiment shown in FIG. 7, where components inside of the optocoupler package can be seen.
Figure 8B:
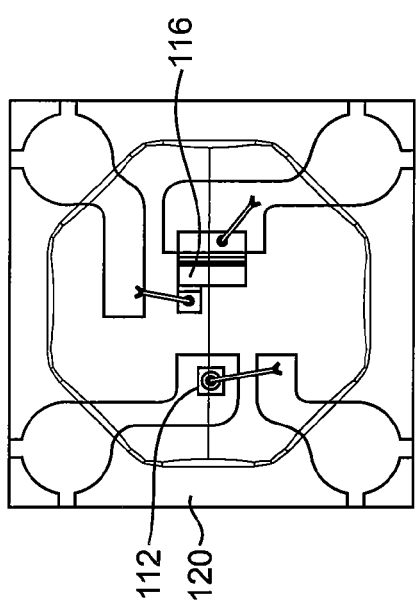
Figure 8C:
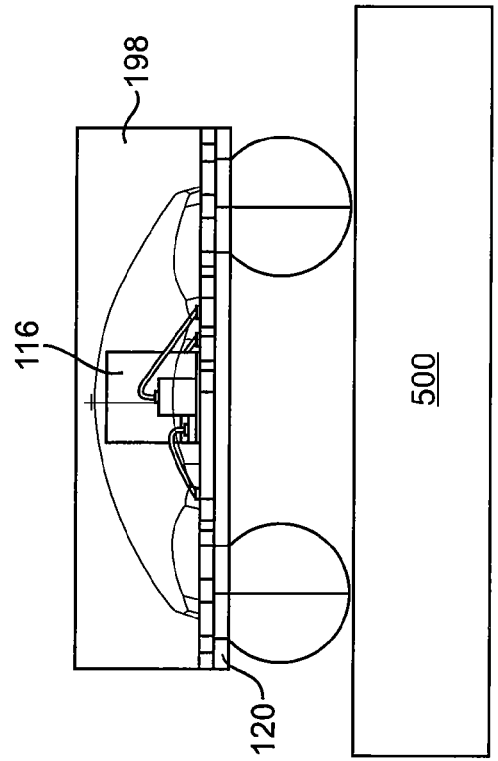

FIGS. 8(a), 8(b), and 8(c) respectively show top, and side views of the optocoupler package 300 embodiment shown in FIG. 7, where components inside of the optocoupler package 300 can be seen. FIG. 8(c) also shows a circuit substrate 500 and the optocoupler package 300 mounted on the circuit substrate. The circuit substrate 500 may be a circuit board or the like. For ease of illustration, circuit lines, and pads, and distinct layers are not shown in the circuit substrate 500.

As shown in FIG. 8(b), light from the emitter surface 112(a) of the optical emitter device 112 can be received by the facing receiver surface 116(a) of the optical receiver device 116. Communication between the optical emitter device 112 and the optical receiver device 116 is efficient.

FIGS. 9(a)-9(g) show components of an optocoupler package as it is being assembled. FIG. 9(a) shows a premolded substrate 120 which can be obtained. As shown in FIG. 9(b), after the substrate 120 is obtained, an optical emitter device 112 can be mounted an exposed region of the substrate 120. Before, during, or after the optical emitter device 112 is mounted on the substrate 120, as shown in FIG. 9(c), the device assembly 170 can be mounted to the substrate. As shown in FIG. 9(d), wirebonds 184, 193 can then be formed on the substrate 120, thereby electrically coupling the optical emitter device 112 to corresponding exposed regions of the substrate 120, and electrically coupling the clips of the device assembly 170 to corresponding exposed regions of the substrate 120.

After all devices are mounted to the substrate 120 and after all wirebonds are formed on the substrate 120, a light transmissive material 190 is deposited on the substrate 120 and covers the device assembly 170 and the optical emitter device 112 as shown in FIG. 9(e). Then, a molding material 198 is formed (e.g., injected) on the light coupling gel material 194 as shown in FIG. 9(f). Molding processes are well known in the art and in the industry. After the molding compound material 198 is placed on the light coupling gel material 194, the solder balls 140 are placed on the substrate 120 as shown in FIG. 9(g) to form an optocoupler package 300. FIG. 9(g) shows the optocoupler package in a "live bug" position.

Embodiments of the invention provide a number of other advantages. For example, the device assemblies described above can be mounted anywhere on the previously described substrate and devices need not be mounted on conductive lands that are formed in the substrate. For example, the device assembly 170 in FIGS. 3 and 7 can be mounted on any portion of the insulating surface of the substrate 120 and need not be mounted a conductive exposed region. This advantageously provides for greater flexibility in the package manufacturing process.

The above-described optocoupler packages can be used in electrical assemblies including circuit substrates, as well as systems which may be embodied by cell phones and computers.

While the foregoing is directed to certain preferred embodiments of the present invention, other and further embodiments of the invention may be devised without departing from the basic scope of the invention. Such alternative embodiments are intended to be included within the scope of the present invention. Moreover, the features of one or more embodiments of the invention may be combined with one or more features of other embodiments of the invention without departing from the scope of the invention.

What is claimed is:

1. An optocoupler package comprising:
    a substrate comprising a substrate surface;
    a first optoelectronic device;
    a first clip structure attached to the first optoelectronic device, wherein the first clip structure and the first optoelectronic device are mounted on the substrate surface;
    a second clip structure attached to a surface of the first optoelectronic device which is opposite the first clip structure; and
    a second optoelectronic device mounted on the substrate, wherein the second optoelectronic device has a light emitter surface and the first optoelectronic device has a receiver surface, and wherein the first and second optoelectronic devices are oriented to allow the emitter surface to provide light directly to the receiver surface.

2. The optocoupler package of claim 1 wherein the first optoelectronic device is an optical receiver device and the second optoelectronic device is an optical emitter device.

3. The optocoupler package of claim 1 wherein the angle is about 90 degrees.

4. The optocoupler package of claim 1 wherein the first clip structure is in the form of an L.

5. The optocoupler package of claim 1 wherein the substrate comprises a premolded substrate.

6. The optocoupler package of claim 5 further comprising solder structures around the first optoelectronic device and the second optoelectronic device.

7. The optocoupler package of claim 6 further comprising a light transmissive material on the first optoelectronic device and the second optoelectronic device.

8. The optocoupler package of claim 1 wherein the substrate comprises a first surface and a second surface, wherein the first and second optoelectronic devices are attached to the first surface of the substrate and wherein the optocoupler package further comprises solder structures attached to the second surface of the substrate.

9. The optocoupler package of claim 8 further comprising a molding material molded over the first and second optoelectronic devices.

10. A method for making an optocoupler package, the method comprising:
    obtaining a substrate comprising a substrate surface;
    obtaining a first optoelectronic device having a first surface and a second surface opposite to the first surface;
    attaching a first clip structure to the first surface of the first optoelectronic device;
    attaching a second clip structure to the second surface of the first optoelectronic device;
    attaching the first clip structure and the first optoelectronic device to the substrate, and wherein the first optoelectronic device is oriented at an angle with respect to the substrate surface; and
    attaching a second optoelectronic device to the substrate;
    wherein the second optoelectronic device has a light emitter surface and the first optoelectronic device has a receiver surface, and wherein the first and second optoelectronic devices are oriented to allow the emitter surface to provide light directly to the receiver surface after the first optoelectronic device and the second optoelectronic device are attached to the substrate.

11. The method of claim 10 wherein the first optoelectronic device is an optical receiver device and the second optoelectronic device is an optical emitter device.

12. The method of claim 10 wherein the first clip structure is attached to the first optoelectronic device using solder.

13. The method of claim 11 further comprising depositing an optically transmissive material on the first and second optoelectronic devices.

14. The method of claim 10 further comprising attaching solder structures to the substrate.

15. The method of claim 10 further comprising depositing an optically transmissive material on the first and second optoelectronic devices, and then molding a molding material around the optically transmissive material.

16. The method of claim 10 wherein the substrate is a premolded substrate.

17. The method of claim 10 further comprising wirebonding the first and the second optoelectronic devices to the substrate.

18. An optocoupler package comprising:
    a substrate comprising a substrate surface;
    a first optoelectronic device having a first surface and a second surface opposite to the first surface;
    a first clip structure attached to the first surface of the first optoelectronic device, wherein the clip structure and the first optoelectronic device are mounted on the substrate, and wherein the first optoelectronic device is disposed over the substrate surface and is oriented at an angle with respect to the substrate surface;
    a second clip structure having a first portion attached to the second surface of the first optoelectronic device and a second portion;
    a wirebond attached to the second portion of the second clip structure; and
    a second optoelectronic device mounted on the substrate and optically coupled to the first optoelectronic device.

19. The optocoupler package of claim 18 wherein the first optoelectronic device is an optical receiver device and the second optoelectronic device is an optical emitter device.

20. The optocoupler package of claim 18 wherein the angle is about 90 degrees.

21. The optocoupler package of claim 18 wherein the first clip structure is in the form of an L.

22. The optocoupler package of claim 18 wherein the substrate comprises a premolded substrate.

23. The optocoupler package of claim 22 further comprising solder structures around the first optoelectronic device and the second optoelectronic device.

24. The optocoupler package of claim 23 further comprising a light transmissive material on the first optoelectronic device and the second optoelectronic device.

25. The optocoupler package of claim 18 wherein the substrate comprises a first surface and a second surface, wherein the first and second optoelectronic devices are attached to the first surface of the substrate and wherein the optocoupler package further comprises solder structures attached to the second surface of the substrate.

26. The optocoupler package of claim 25 further comprising a molding material molded over the first and second optoelectronic devices.

* * * * *